United States Patent
Azuhata

(10) Patent No.: US 12,133,008 B2
(45) Date of Patent: Oct. 29, 2024

(54) SOLID-STATE IMAGING ELEMENT AND IMAGING DEVICE

(71) Applicant: Sony Semiconductor Solutions Corporation, Kanagawa (JP)

(72) Inventor: Satoshi Azuhata, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 29 days.

(21) Appl. No.: 17/798,460

(22) PCT Filed: Jan. 26, 2021

(86) PCT No.: PCT/JP2021/002567
§ 371 (c)(1),
(2) Date: Aug. 9, 2022

(87) PCT Pub. No.: WO2021/192576
PCT Pub. Date: Sep. 30, 2021

(65) Prior Publication Data
US 2023/0049629 A1    Feb. 16, 2023

(30) Foreign Application Priority Data

Mar. 23, 2020 (JP) ................................. 2020-050475

(51) Int. Cl.
*H04N 25/75* (2023.01)
*H04N 25/768* (2023.01)
(Continued)

(52) U.S. Cl.
CPC ........... *H04N 25/75* (2023.01); *H04N 25/768* (2023.01); *H04N 25/772* (2023.01); *H04N 25/778* (2023.01); *H04N 25/79* (2023.01)

(58) Field of Classification Search
None
See application file for complete search history.

(56) References Cited

U.S. PATENT DOCUMENTS

| 2010/0020217 A1* | 1/2010 | Abe .................... H04N 25/621 348/308 |
| 2013/0027595 A1* | 1/2013 | Hashizume ............ H04N 25/75 348/302 |

(Continued)

FOREIGN PATENT DOCUMENTS

| JP | 2015-231051 A | 12/2015 |
| JP | 2019-216379 A | 12/2019 |
| WO | 2016/031594 A1 | 3/2016 |

OTHER PUBLICATIONS

International Search Report (PCT/ISA/210), International Application No. PCT/JP2021/002567, dated Apr. 20, 2021.

(Continued)

*Primary Examiner* — Mark T Monk
(74) *Attorney, Agent, or Firm* — Michael Best & Friedrich LLP

(57) ABSTRACT

To improve a frame rate in a solid-state imaging element that compares a reference signal and a pixel signal.

The solid-state imaging element includes a differential amplifier circuit, a transfer transistor, and a source follower circuit. The differential amplifier circuit amplifies a difference between the potentials of a pair of input nodes and outputs the difference from an output node. The transfer transistor transfers charge from a photoelectric conversion element to a floating diffusion layer. The auto-zero transistor short-circuits the floating diffusion layer and the output node in a predetermined period. The source follower circuit supplies a potential to one of the pair of input nodes according to a potential of the floating diffusion layer.

14 Claims, 16 Drawing Sheets

(51) Int. Cl.
*H04N 25/772* (2023.01)
*H04N 25/778* (2023.01)
*H04N 25/79* (2023.01)

(56) References Cited

U.S. PATENT DOCUMENTS

2015/0136955 A1    5/2015  Wein
2017/0187975 A1*  6/2017  Hanzawa ............... H04N 25/76
2018/0332248 A1*  11/2018  Nishida ............. H01L 27/14609

OTHER PUBLICATIONS

Masaki Sakakibara, et al., "A 6.9-μm Pixel-Pitch Back-Illuminated Global Shutter CMOS Image Sensor With Pixel-Parallel 14-Bit Subthreshold ADC", IEEE Journal of Solid-State Circuits 2018.

* cited by examiner a b a b

SOLID-STATE IMAGING ELEMENT AND IMAGING DEVICE

TECHNICAL FIELD

The present technique relates to a solid-state imaging element and an imaging device. Specifically, the present technique relates to a solid-state imaging element including an ADC (Analog to Digital Converter) for each pixel, and an imaging device.

BACKGROUND ART

Conventionally, a solid-state imaging element including an ADC for each pixel is used to capture image data at high speeds. For example a solid-state imaging element including circuits dispersedly placed on stacked two chips is proposed, the circuit including an ADC for each pixel (for example, see NPL1). In this solid-state imaging element, a floating diffusion layer in a pixel is connected to one of the two input terminals of a differential amplifier circuit in the ADC and a reference signal is inputted to the other input terminal.

CITATION LIST

Non Patent Literature

[NPL 1]
Masaki Sakakibara, et al., A 6.9-µm Pixel-Pitch Back-Illuminated Global Shutter CMOS Image Sensor With Pixel-Parallel 14-Bit Subthreshold ADC, IEEE Journal of Solid-State Circuits 2018.

SUMMARY

Technical Problem

In the related art, the circuits are dispersedly placed on the stacked two chips, achieving enhanced functionality and finer pixels. However, in the related art, a change of the reference signal may be transmitted to the node of the floating diffusion layer via a parasitic capacitance in the differential amplifier circuit and lead to fluctuations in the potential of the node. The fluctuations in potential may delay the timing of inverting the output of the differential amplifier circuit, so that the delay may reduce a frame rate.

Having been achieved in light of such circumstances, an object of the present technique is to improve a frame rate in a solid-state imaging element that compares a reference signal and a pixel signal.

Solution to Problem

The present technique has been devised to solve the problem. A first aspect is a solid-state imaging element including: a differential amplifier circuit that amplifies a difference between the potentials of a pair of input nodes and outputs the difference from an output node; a transfer transistor that transfers charge from a photoelectric conversion element to a floating diffusion layer; an auto-zero transistor that short-circuits the floating diffusion layer and the output node in a predetermined period; and a source follower circuit that supplies a potential to one of the pair of input nodes according to a potential of the floating diffusion layer. This has the effect of suppressing fluctuations in the potential of the floating diffusion layer.

The first aspect may further include a signal processing unit that performs predetermined signal processing on a digital signal corresponding to the difference. This has the effect of generating a frame in which the signal having been subjected to the signal processing is arranged.

In the first aspect, the signal processing may include correlated double sampling. This has the effect of reducing the noise of the digital signal.

In the first aspect, the signal processing may further include time delay integration. This has the effect of generating the frame with high image quality.

In the first aspect, the source follower circuit may include: a first current source transistor that supplies a predetermined current; and a source follower transistor that has the gate connected to the floating diffusion layer and the source connected to the first current source transistor and one of the pair of input nodes. This has the effect of inputting a potential to the differential amplifier circuit according to the potential of the floating diffusion layer.

In the first aspect, the differential amplifier circuit may include a pair of differential transistors; and a second current source transistor that is commonly connected to the sources of the pair of differential transistors and supplies a predetermined current, a predetermined reference signal may be inputted to one of gates of the pair of differential transistors, and the potential from the source follower circuit may be inputted to the other gate of the pair of differential transistors. This has the effect of amplifying a difference between the input nodes.

In the first aspect, the transfer transistor, the source follower circuit, and a part of the differential amplifier circuit may be provided on a predetermined light-receiving chip, and the rest of the differential amplifier circuit may be provided on a predetermined circuit chip. This has the effect of dispersedly placing the circuits on the multiple chips.

In the first aspect, the light-receiving chip and the circuit chip may be connected by Cu—Cu bonding. This provides the effect of electrically connecting the chips.

A second aspect of the present technique is an imaging device including: a differential amplifier circuit that amplifies a difference between the potentials of a pair of input nodes and outputs the difference from an output node; a transfer transistor that transfers charge from a photoelectric conversion element to a floating diffusion layer; an auto-zero transistor that short-circuits the floating diffusion layer and the output node in a predetermined period; a source follower circuit that supplies a potential to one of the pair of input nodes according to a potential of the floating diffusion layer; and a storage unit that stores a frame in which a digital signal corresponding to the difference is arranged. This has the effect of improving a frame rate.

DESCRIPTION OF EMBODIMENTS

Modes for carrying out the present technique (hereinafter also referred to as "embodiments") will be described below. The description will be given in the following order.
1. First Embodiment (an example in which a source follower circuit is added)
2. Second Embodiment (an example in which a source follower circuit is added and time delay integration is not performed)
3. Example of application to moving body 1. First Embodiment

[Configuration Example of Imaging Device]

Figure 1:
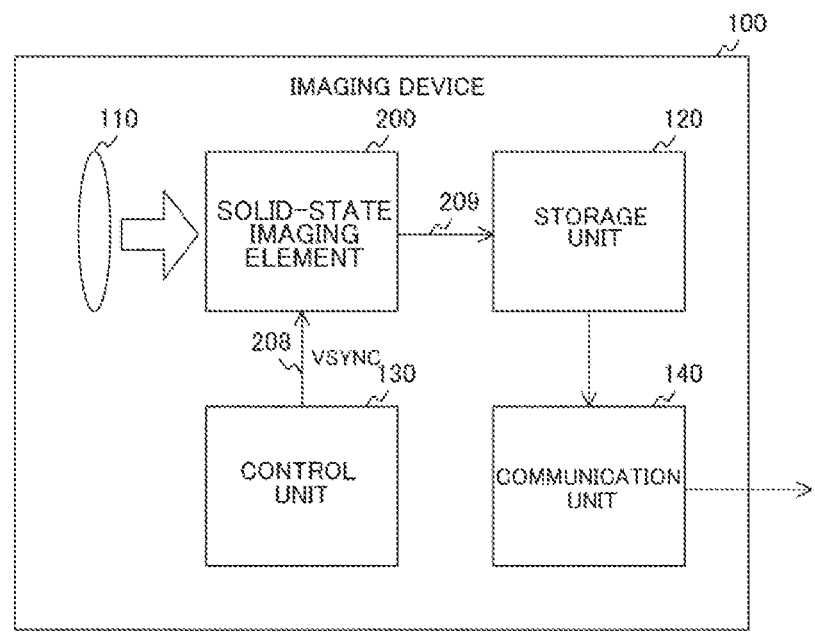
FIG. 1 is a block diagram illustrating a configuration example of an imaging device according to a first embodiment of the present technique.

FIG. 1 is a block diagram illustrating a configuration example of an imaging device 100 according to a first embodiment of the present technique. The imaging device 100 is a device that captures image data and includes an optical unit 110, a solid-state imaging element 200, a storage unit 120, a control unit 130, and a communication unit 140.

The optical unit 110 condenses incident light and guides the light to the solid-state imaging element 200. The solid-state imaging element 200 captures image data. The solid-state imaging element 200 supplies the image data to the storage unit 120 via a signal line 209.

The storage unit 120 stores the image data. The control unit 130 controls the solid-state imaging element 200 to capture the image data. The control unit 130 supplies a vertical synchronizing signal VSYNC, which indicates the timing of imaging, to the solid-state imaging element 200 via, for example, a signal line 208.

The communication unit 140 reads the image data from the storage unit 120 and transmits the data to the outside.

Figure 2:
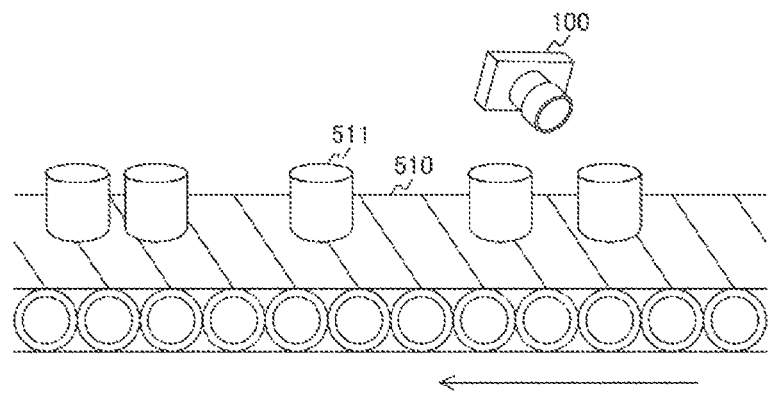
FIG. 2 is an explanatory drawing illustrating an example of using an imaging system according to the first embodiment of the present technique.

FIG. 2 is an explanatory drawing illustrating an example of using the imaging device 100 according to the first embodiment of the present technique. As illustrated in FIG. 2, the imaging device 100 is used in, for example, a factory equipped with a belt conveyor 510.

The belt conveyor 510 moves a subject 511 at a constant speed in a predetermined direction. The imaging device 100 is fixed near the belt conveyor 510 and captures an image of the subject 511 to generate image data. The image data is used for, for example, inspecting the presence or absence of a defect. This achieves FA (Factory Automation).

The imaging device 100 that captures an image of the subject 511 moving at a constant speed is not limited to this configuration. The imaging device 100 may be configured to capture an image while moving at a constant speed with respect to the subject in, for example, aerial photography.

[Configuration Example of Solid-State Imaging Element]

Figure 3:
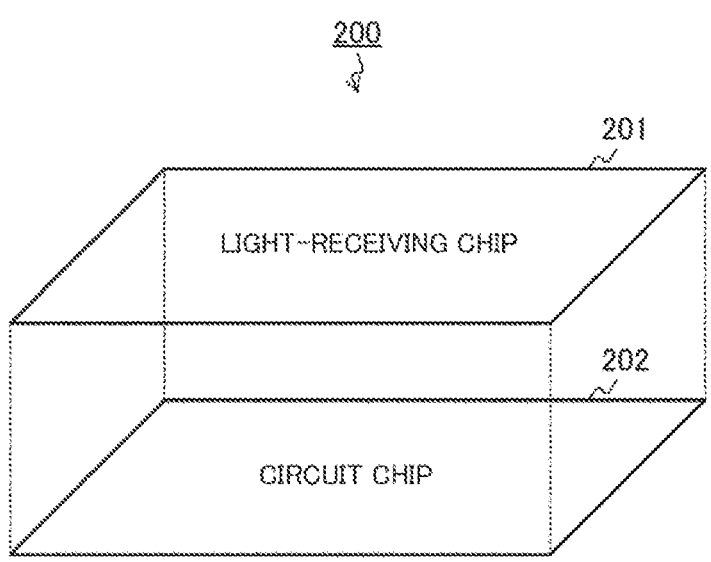
FIG. 3 is a diagram illustrating an example of the laminated structure of a solid-state imaging element according to the first embodiment of the present technique.

FIG. 3 is a diagram illustrating an example of the laminated structure of the solid-state imaging element 200 in the first embodiment of the present technique. The solid-state imaging element 200 includes a circuit chip 202 and a light-receiving chip 201 stacked on the circuit chip 202. These chips are electrically connected to each other via connection parts such as a via. In addition to a via, the chips can also be connected by Cu—Cu bonding or bumps.

Figure 4:
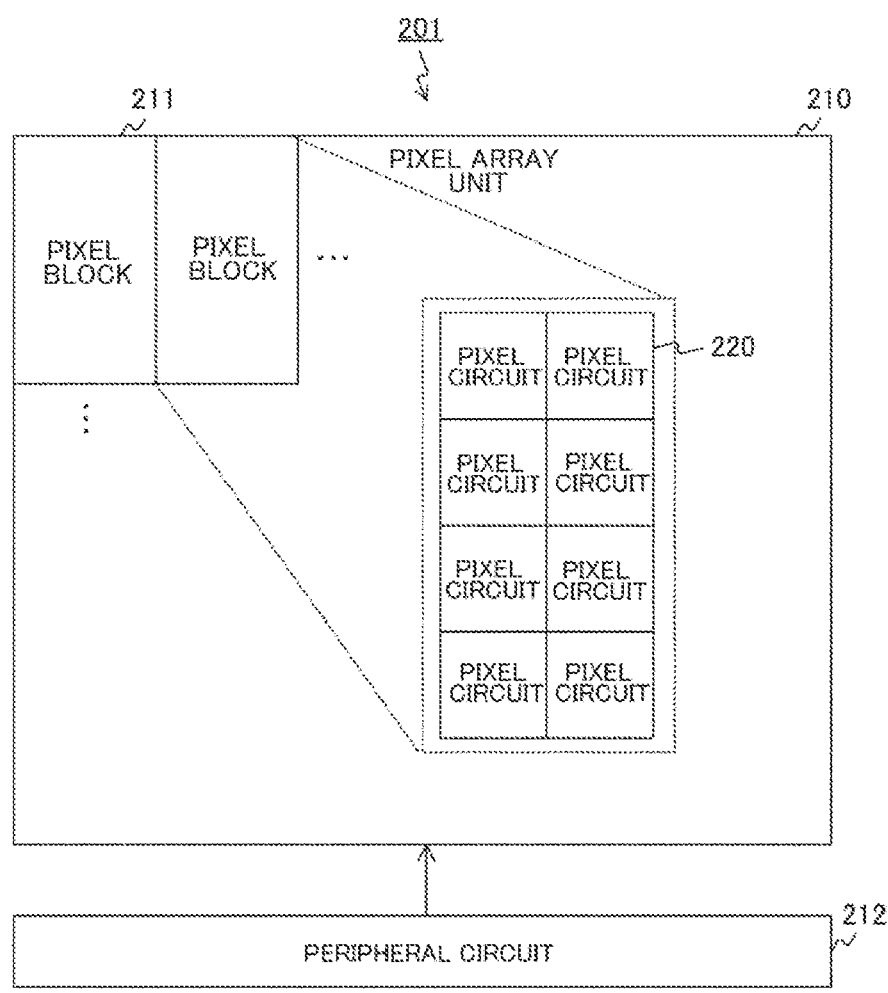
FIG. 4 is a block diagram illustrating a configuration example of a light-receiving chip according to the first embodiment of the present technique.

FIG. 4 is a block diagram illustrating a configuration example of the light-receiving chip 201 according to the first embodiment of the present technique. The light-receiving chip 201 includes a pixel array unit 210 and a peripheral circuit 212.

In the pixel array unit 210, a plurality of pixel circuits 220 are arranged in a two-dimensional grid pattern. Furthermore, the pixel array unit 210 is divided into a plurality of pixel blocks 211. In each of the pixel blocks 211, for example, the pixel circuits 220 are placed in four rows×two columns. For each of the pixel circuits 220, a plurality of transistors are further disposed outside the pixel circuits 220. The transistors are omitted in the drawing for the convenience of description.

In the peripheral circuit 212, for example, a circuit for supplying DC (Direct Current) voltage is disposed.

Figure 5:
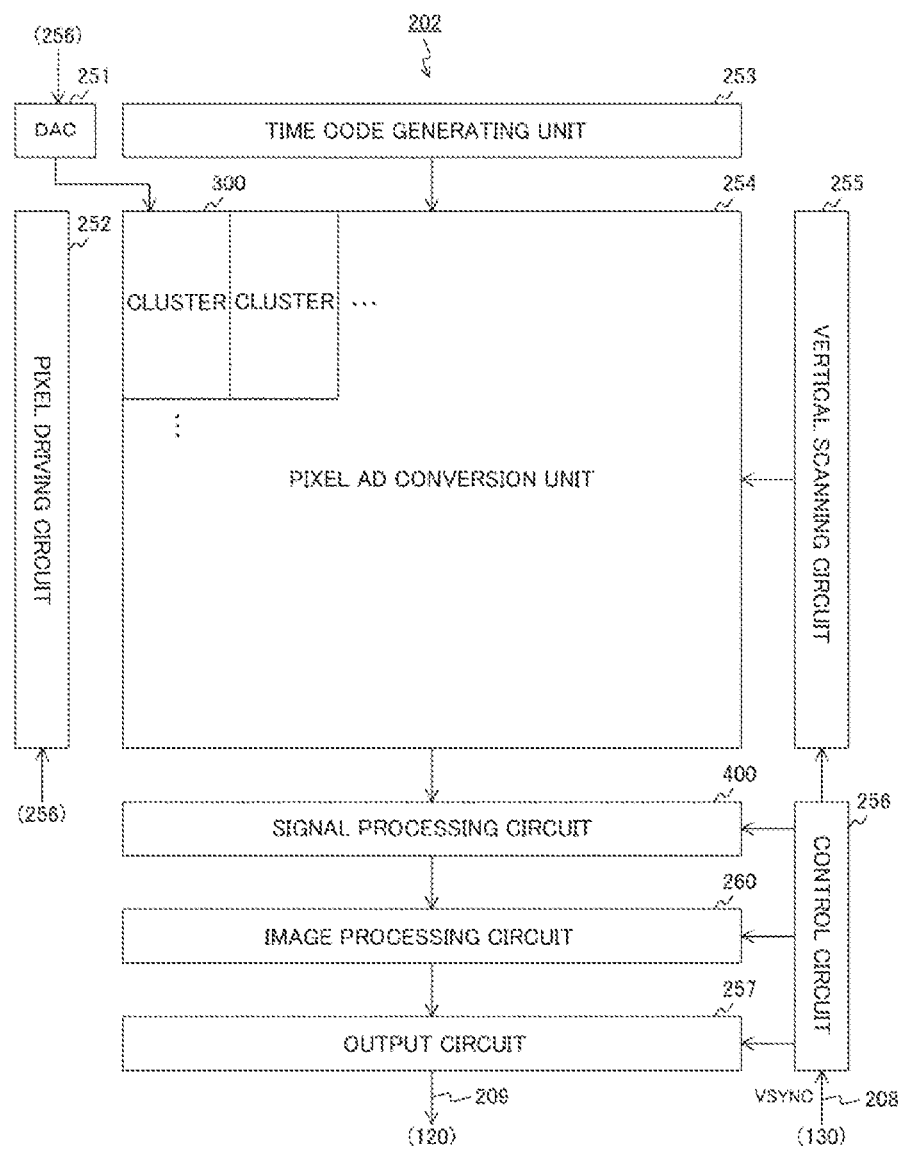
FIG. 5 is a block diagram illustrating a configuration example of a circuit chip according to the first embodiment of the present technique.

FIG. 5 is a block diagram illustrating a configuration example of the circuit chip 202 according to the first embodiment of the present technique. Disposed in the circuit chip 202 are a DAC (Digital to Analog Converter) 251, a pixel driving circuit 252, a time code generating unit 253, a pixel AD converting unit 254, and a vertical scanning circuit 255. Furthermore, a control circuit 256, a signal processing circuit 400, an image processing circuit 260, and an output circuit 257 are disposed in the circuit chip 202.

The DAC 251 generates a reference signal through DA (Digital to Analog) conversion over a predetermined AD conversion period. For example, a sawtooth-shaped ramp signal is used as the reference signal. The DAC 251 supplies the reference signal to the pixel AD converting unit 254.

The time code generating unit 253 generates a time code indicating a time in an AD conversion period. The time code generating unit 253 is implemented by, for example, a counter. As a counter, for example, a gray code counter is used. The time code generating unit 253 supplies the time code to the pixel AD converting unit 254.

The pixel driving circuit 252 drives each of the pixel circuits 220 to generate a pixel signal.

The pixel AD converting unit 254 performs AD conversion for converting an analog signal (that is, a pixel signal) of each of the pixel circuits 220 into a digital signal. The pixel AD converting unit 254 is divided into a plurality of clusters 300. The cluster 300 is provided for each of the pixel blocks 211 and converts an analog signal in the corresponding pixel block 211 into a digital signal.

The pixel AD converting unit 254 generates image data, in which digital signals are arranged by AD conversion, as a frame and supplies the frame to the signal processing circuit 400.

The vertical scanning circuit 255 drives the pixel AD converting unit 254 to perform AD conversion.

The signal processing circuit 400 performs predetermined signal processing on the frame. A variety of processing including CDS (Correlated Double Sampling) processing is performed as the signal processing. The signal processing circuit 400 supplies the processed frame to the image processing circuit 260.

The image processing circuit 260 performs predetermined image processing on the frame from the signal processing circuit 400. Image recognition, black level correction, image correction, or demosaicing is performed as the image processing. The image processing circuit 260 supplies the processed frame to the output circuit 257.

The output circuit 257 outputs, to the outside, the frame having been subjected to the image processing.

The control circuit 256 controls the timing of operating the DAC 251, the pixel driving circuit 252, the vertical scanning circuit 255, the signal processing circuit 400, the image processing circuit 260, and the output circuit 257 in synchronization with the vertical synchronizing signal VSYNC.

[Configuration Example of Pixel AD Converting Unit]

Figure 6:
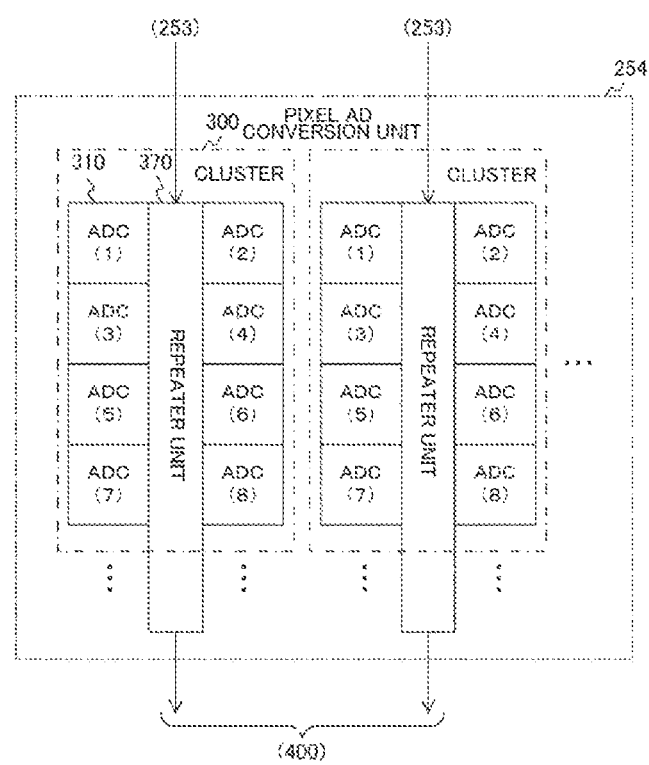
FIG. 6 is a diagram illustrating a configuration example of a pixel AD (Analog to Digital) converting unit according to the first embodiment of the present technique.

FIG. 6 is a diagram illustrating a configuration example of the pixel AD converting unit 254 according to the first embodiment of the present technique. In the pixel AD converting unit 254, a plurality of ADCs 310 are arranged in a two-dimensional grid pattern. The ADC 310 is disposed for each of the pixel circuits 220. If the pixel circuits 220 are arranged in N (N is an integer) rows and M (M is an integer) columns, the N×M ADCs 310 are disposed.

In each of the clusters 300, the ADCs 310 are disposed as many as the pixel circuits 220 in the pixel block 211. If the pixel circuits 220 are arranged in four rows and two columns in the pixel block 211, the ADCs 310 are arranged in four rows and two columns also in the cluster 300.

The ADC 310 performs AD conversion on an analog pixel signal generated by the corresponding pixel circuit 220. In the AD conversion, the ADC 310 compares the pixel signal and the reference signal and holds a time code when the comparison result is inverted. The ADC 310 then outputs the held time code as a digital signal after the AD conversion.

Moreover, a repeater unit 370 is disposed for each column of the clusters 300. If the number of columns of the clusters 300 is M/2, the M/2 repeater units 370 are disposed. The repeater unit 370 transfers a time code. The repeater unit 370 transfers the time code from the time code generating unit 253 to the ADC 310. Furthermore, the repeater unit 370 transfers a digital signal from the ADC 310 to the signal processing circuit 400. The transfer of the digital signal is also referred to as "reading" of the digital signal.

In FIG. 6, numbers in parentheses indicate an example of the reading order of the digital signals of the ADCs 310. For example, the digital signal of the odd-numbered column of the first row is first read, and the digital signal of the even-numbered column of the first row is secondly read. The digital signal of the odd-numbered column of the second row is thirdly read, and the digital signal of the even-numbered column of the second row is thirdly read. Likewise, the digital signals of the odd-numbered columns and the even-numbered columns in the subsequent rows are sequentially read.

Although the ADC 310 is disposed for each of the pixel circuits 220, the present invention is not limited to this configuration. The single ADC 310 may be shared by the multiple pixel circuits 220.

[Configuration Example of ADC]

Figure 7:
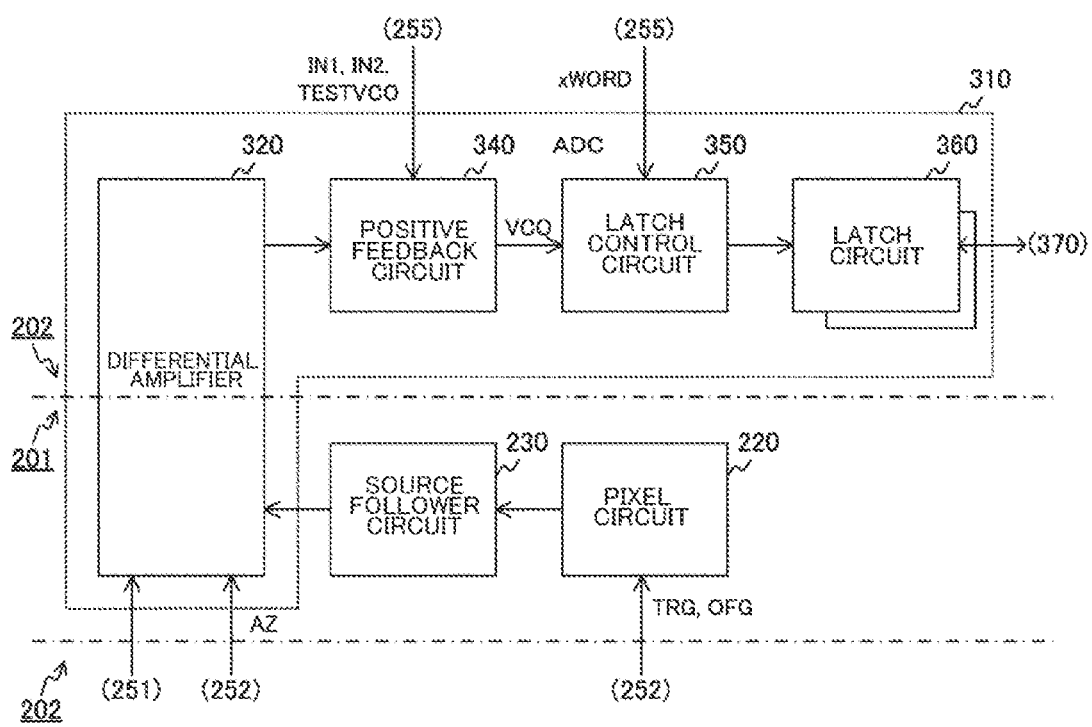
FIG. 7 is a block diagram illustrating a configuration example of an ADC according to the first embodiment of the present technique.

FIG. 7 is a block diagram illustrating a configuration example of the ADC 310 according to the first embodiment of the present technique. The ADC 310 includes a differential amplifier 320, a positive feedback circuit 340, a latch control circuit 350, and a plurality of latch circuits 360.

Furthermore, a source follower circuit 230 is disposed between the pixel circuit 220 and the ADC 310. The source follower circuit 230 supplies a signal with a potential $V_{SOUT}$ to the ADC 310 in response to a potential $V_{SIN}$ of the pixel signal from the pixel circuit 220. A circuit including the pixel circuit 220 and the source follower circuit 230 acts as a pixel.

The pixel circuit 220, the source follower circuit 230, and a part of the differential amplifier 320 are disposed on the light-receiving chip 201, whereas the rest of the differential amplifier 320 and the circuits in the subsequent stages are disposed on the circuit chip 202.

The differential amplifier 320 compares the pixel signal from the source follower circuit 230 and the reference signal from the DAC 251. The differential amplifier 320 supplies a comparison result signal indicating a comparison result to the positive feedback circuit 340.

The positive feedback circuit 340 adds a part of the output to the input (comparison result signal) and supplies the addition result as an output signal VCO to the latch control circuit 350.

The latch control circuit 350 causes the latch circuits 360 to hold a time code at the time of the inversion of the output signal VCO, in response to a control signal xWORD from the vertical scanning circuit 255.

The latch circuits 360 hold the time code from the repeater unit 370 under the control of the latch control circuit 350. The latch circuits 360 are provided as many as the number of bits of the time code. For example, in the case of a 15-bit time code, the fifteen latch circuits 360 are disposed in the ADC 310. The held time code is read by the repeater unit 370 as a digital signal after the AD conversion.

With the configuration illustrated in FIG. 7, the ADC 310 converts the pixel signal from the source follower circuit 230 into a digital signal.

[Configuration Example of Differential Amplifier and Positive Feedback Circuit]

Figure 8:
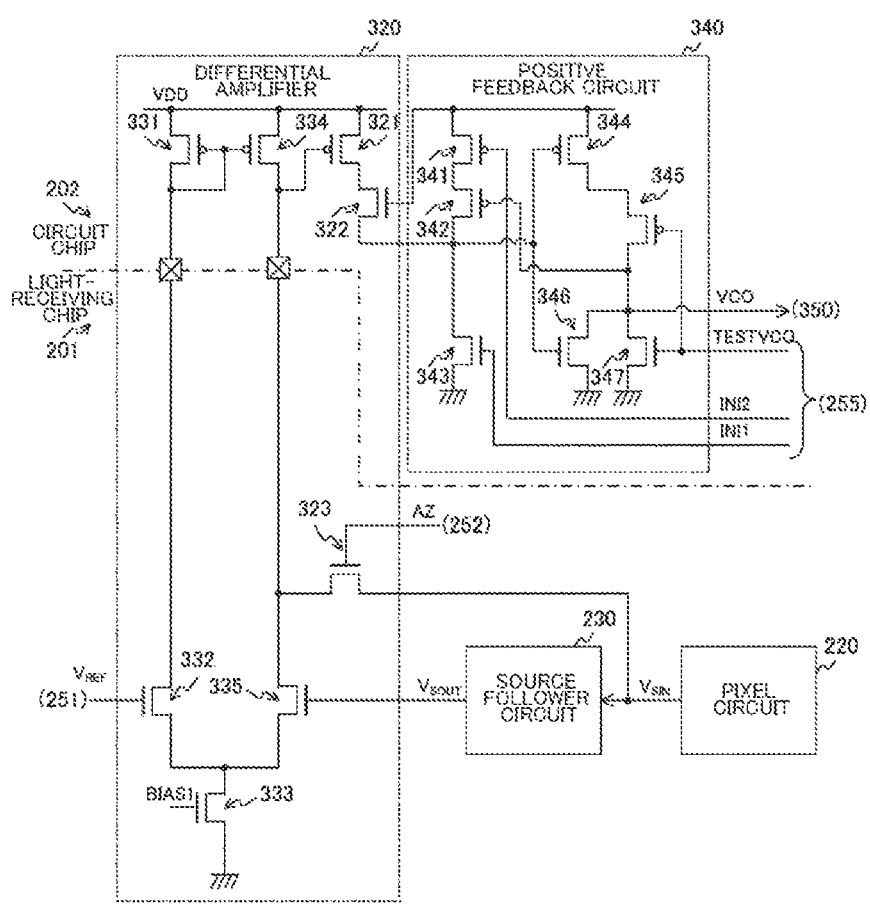
FIG. 8 is a circuit diagram illustrating a configuration example of a differential amplifier and a positive feedback circuit according to the first embodiment of the present technique.

FIG. 8 is a circuit diagram illustrating a configuration example of the pixel circuit 220, the differential amplifier 320, and the positive feedback circuit 340 according to the first embodiment of the present technique.

The differential amplifier 320 includes pMOS (p-channel Metal Oxide Semiconductor) transistors 331, 334, and 321. Furthermore, the differential amplifier 320 includes an nMOS (n-channel MOS) transistor 322, an auto-zero transistor 323, differential amplifiers 332 and 335, and a current source transistor 333. The auto-zero transistor 323, the differential amplifiers 332 and 335, and the current source transistor 333 are disposed on the light-receiving chip 201, whereas the other transistors are disposed on the circuit chip 202. As the differential amplifiers 332 and 335, for example, an nMOS transistor is used. As the auto-zero transistor 323 and the current source transistor 333, for example, nMOS transistors are used.

The differential transistors 332 and 335 constitute a differential pair, and the sources of these transistors are commonly connected to the drain of the current source transistor 333. The drain of the differential transistor 332 is connected to the drain of the pMOS transistor 331 and the gates of the pMOS transistors 331 and 334. The drain of the differential transistor 335 is connected to the drain of the pMOS transistor 334 and the gate of the pMOS transistor 321. The reference signal from the DAC 251 is inputted to the gate of the differential transistor 332. The potential of the reference signal is denoted as $V_{REF}$.

A predetermined bias voltage BIAS1 is applied to the gate of the current source transistor 333, and a predetermined ground voltage is applied to the source of the current source transistor 333. The current source transistor 333 supplies a current according to the bias voltage BIAS1.

The pixel signal from the source follower circuit 230 is inputted to the gate of the differential transistor 335. The potential of the pixel signal is denoted as $V_{SOUT}$.

The pMOS transistors 331, 334, and 321 constitute a current mirror circuit. A power supply voltage VDD is applied to the sources of the pMOS transistors 331, 334, and 321.

The drain of the nMOS transistor 322 is connected to the drain of the pMOS transistor 321, and the source thereof is connected to the positive feedback circuit 340.

The auto-zero transistor 323 short-circuits the drain of the differential transistor 335 and the input node of the source follower circuit 230 in response to an auto-zero signal AZ from the pixel driving circuit 252.

The positive feedback circuit 340 includes pMOS transistors 341, 342, 344, and 345 and nMOS transistors 343, 346, and 347. The pMOS transistors 341 and 342 and the nMOS transistor 343 are connected in series with the gate of the nMOS transistor 322. Furthermore, a drive signal INI2 from the vertical scanning circuit 255 is inputted to the gate of the pMOS transistor 341. The connection point of the pMOS transistor 342 and the nMOS transistor 343 is connected to the source of the nMOS transistor 322.

A ground voltage is applied to the source of the nMOS transistor 343, and a drive signal INI1 from the vertical scanning circuit 255 is inputted to the gate.

The pMOS transistors 344 and 345 are connected in series with the gate of the nMOS transistor 322. The drain of the pMOS transistor 345 is connected to the gate of the pMOS transistor 342 and the drains of the nMOS transistors 346 and 347. A control signal TESTVCO from the vertical scanning circuit 255 is inputted to the gates of the pMOS transistor 345 and the nMOS transistor 347. The gates of the pMOS transistor 344 and the nMOS transistor 346 are connected to the connection point of the pMOS transistor 342 and the nMOS transistor 343.

The output signal VCO is outputted from the connection point of the pMOS transistor 345 and the nMOS transistor 347. A ground voltage is applied to the sources of the nMOS transistors 346 and 347.

The differential amplifier 320 and the positive feedback circuit 340 are not limited to the circuits illustrated in FIG. 8 if the functions described in FIG. 7 are provided.

Figure 9:
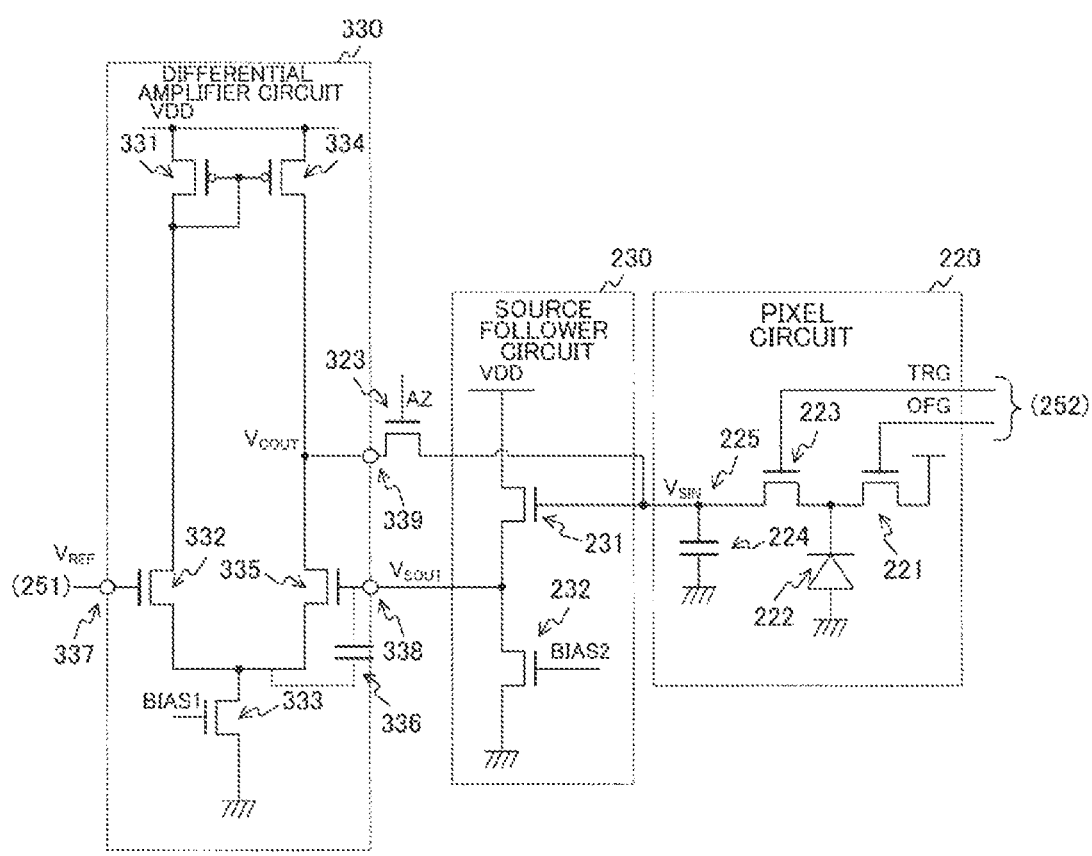
FIG. 9 is a circuit diagram illustrating a configuration example of a source follower circuit and a pixel circuit according to the first embodiment of the present technique.

FIG. 9 is a circuit diagram illustrating a configuration example of the source follower circuit 230 and the pixel circuit 220 according to the first embodiment of the present technique. The pixel circuit 220 includes a discharge transistor 221, a photoelectric conversion element 222, a transfer transistor 223, and a floating diffusion layer 224. The source follower circuit 230 includes a source follower transistor 231 and a current source transistor 232. As the discharge transistor 221, the transfer transistor 223, the source follower transistor 231, and the current source transistor 232, for example, nMOS transistors are used.

The discharge transistor 221 discharges charge stored in the photoelectric conversion element 222, in response to a drive signal OFG from the pixel driving circuit 252. The photoelectric conversion element 222 generates charge by photoelectric conversion.

The transfer transistor 223 transfers charge from the photoelectric conversion element 222 to the floating diffusion layer 224 according to a transfer signal TRG from the pixel driving circuit 252.

The floating diffusion layer 224 stores the transferred charge and generates a voltage corresponding to the amount of charge. The floating diffusion layer 224 has the node near the transfer transistor 223, the node being denoted as a floating-diffusion layer node 225 having a potential $V_{SIN}$.

The gate of the source follower transistor 231 is connected to the floating-diffusion layer node 225 of the floating diffusion layer 224. The source of the source follower transistor 231 is connected to the drain of the current source transistor 232.

A predetermined bias voltage BIAS2 is applied to the gate of the current source transistor 232, and a predetermined ground voltage is applied to the source of the current source transistor 232. The current source transistor 232 supplies a current according to the bias voltage BIAS2.

The connection node of the source follower transistor 231 and the current source transistor 232 (that is, the source of the source follower transistor 231) is connected to the gate of the differential transistor 335.

Between a gate potential $V_{SIN}$ and a source potential $V_{SOUT}$ of the source follower transistor 231 when the source follower transistor 231 has a gate-source voltage $V_{GS}$, the following equation is formulated:

$$V_{SIN} = V_{SOUT} + V_{GS} \quad \text{Equation 1}$$

According to Equation 1, the source potential $V_{SOUT}$ of the source follower transistor 231 changes with the gate potential $V_{SIN}$.

In the differential amplifier 320, a circuit including the pMOS transistors 331 and 334, the differential amplifiers 332 and 335, and the current source transistor 333 acts as a differential amplifier circuit 330.

The gate of the differential transistor 332 with the potential $V_{REF}$ corresponds to an input node 337 of the differential amplifier circuit 330. The gate of the differential transistor 335 with the potential $V_{SOUT}$ corresponds to an input node 338 of the differential amplifier circuit 330. The gate of the differential transistor 335 with the potential $V_{SOUT}$ corresponds to an output node 339 of the differential amplifier circuit 330. The potential of the output node is denoted as $V_{COUT}$. It is assumed that a parasitic capacitance 336 occurs between the gate and the source of the differential transistor 335.

The differential amplifier circuit 330 amplifies a difference between the potential $V_{REF}$ of the input node 337 and the potential $V_{SOUT}$ of the input node 338 and outputs the difference from the output node 339.

The auto-zero transistor 323 short-circuits the output node 339 of the differential amplifier circuit 330 and the floating-diffusion layer node 225 (in other words, the input node of the source follower circuit 230) in response to the auto-zero signal AZ.

The following description is based on a first comparison example in which the floating-diffusion layer node 225 is directly connected to the gate (that is, the input node 338) of the differential transistor 335 in the absence of the source follower circuit 230. In the first comparison example, the floating-diffusion layer node 225 having a high impedance is directly connected to the input node 338 of the differential amplifier circuit 330, thereby propagating a change of the reference signal to the floating-diffusion layer node 225 through the parasitic capacitance 336 of the differential transistor 335. For example, if the reference signal decreases like a slope, the potential $V_{SIN}$ of the floating-diffusion layer node 225 also decreases accordingly. Thus, the value of the potential $V_{REF}$ has an error when matching the potential $V_{SIN}$, and the propagation delay time of the differential amplifier circuit 330 considerably increases. Factors that increase the propagation delay time include a delay of the timing of matching between the potential $V_{SIN}$ and the potential $V_{REF}$ from the original timing because of a reduction in the potential $V_{SIN}$, and a reduction in the speed of increasing a difference between the input nodes of the differential amplifier circuit 330 even after the potential $V_{SIN}$ and the potential $V_{REF}$ match each other.

Regarding a potential error and an increase in propagation delay time, an error can be eliminated by CDS processing, whereas an increase in propagation delay time cannot be eliminated by CDS processing. An increase in propagation delay time may extend the AD conversion time of the ADC 310, leading to a lower frame rate.

Fluctuations in potential $V_{SIN}$ can be suppressed by increasing the capacity of the floating diffusion layer 224. However, it is not preferable to increase the capacity of the floating diffusion layer 224 because the charge-voltage conversion efficiency of the floating diffusion layer 224 decreases.

Thus, the floating-diffusion layer node 225 directly connected to the gate of the differential transistor 335 may lead to a lower frame rate.

To address the problem, in the circuit including the source follower circuit 230 in FIG. 9, the potential $V_{SOUT}$ changes according to the potential $V_{SIN}$, as exemplified in Equation 1. When the auto-zero transistor 323 is turned off, the source follower circuit 230 reduces the impedance of the potential $V_{SIN}$, thereby preventing fluctuations in the potential $V_{SIN}$ even when the reference signal decreases like a slope. This can prevent fluctuations in the potential $V_{REF}$ from changing the potential $V_{SIN}$. Thus, the AD conversion time can be shorted, leading to a higher frame rate. In the case of, in particular, TDI (Time Delayed Integration) processing, an extremely high frame rate (e.g., 200 to 300 kHz) is requested. The request is easily met by adding the source follower circuit 230.

In the configuration including the source follower circuit 230, the propagation delay time is not increased even if the capacity of the floating diffusion layer 224 is reduced to increase the impedance. This can reduce the capacity of the floating diffusion layer 224 and increase the charge-voltage conversion efficiency while keeping the frame rate.

The following description is based on a second comparison example in which the source follower circuit 230 is provided, an auto zero capacitance is inserted between the source follower circuit 230 and the gate of the differential transistor 335, and the auto-zero transistor develops a short-circuit between the gate and the drain of the differential transistor 335. The second comparison example is described in, for example, Japanese Patent Application No. 2016-545441. In the second comparison example, the potential $V_{SIN}$ of the floating-diffusion layer node 225 can be prevented from changing in response to the reference signal. A gain from the connection node (the output of a source follower) of the source follower transistor 231 and the current source transistor 232 to the gate of the differential transistor 335 is determined by the auto-zero capacitance and the parasitic capacitance 336 and is expressed by the following formula:

$$C_{AZ}/(C_{AZ}+C_{gs})$$

In the above formula, $C_{AZ}$ indicates the capacitance value of the auto-zero capacitance and $C_{gs}$ indicates the capacitance value of the parasitic capacitance 336.

If $C_{AZ}$ and $C_{gs}$ are constant values, a gain is kept constant only with attenuation. However, $C_{gs}$ is not a constant value and has bias dependence, so that a change of the gate voltage of the differential transistor 335 causes a change of the gain, leading to deterioration of linearity.

If $C_{AZ}$ is quite larger than $C_{gs}$, deterioration of linearity can be suppressed. However, the auto-zero capacitance needs to be disposed in a pixel and thus only a capacitance having a small capacitance value (several fF) can be disposed.

This value is only several to ten times larger than $C_{gs}$. $C_{gs}$ has bias dependence of several percent and thus changes a gain by several percent. This change is not a permissible value.

Moreover, the ratio of $C_{AZ}$ to $C_{gs}$ is small, so that the gain has a small absolute value. This deteriorates noise converted to the input of the floating diffusion layer 224.

In this way, the problem of the first comparison example can be solved in the second comparison example, but the linearity deteriorates and noise increases.

In contrast, in a configuration where the auto-zero transistor 323 short-circuits the drain of the differential transistor 335 and the input node of the source follower circuit 230, the auto-zero capacitance is not necessary. This can suppress deterioration of linearity and noise.

Figure 10:
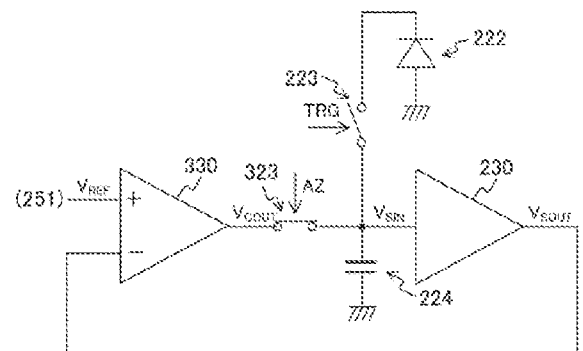
FIG. 10 is an explanatory drawing illustrating a method of controlling transistors in a pixel according to the first embodiment of the present technique.
Figure 10:
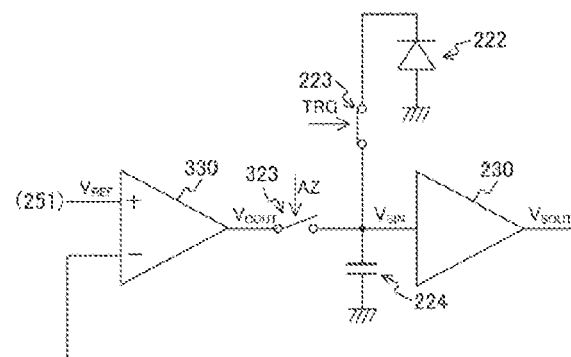

FIG. 10 is an explanatory drawing illustrating a method of controlling the transistors in a pixel according to the first embodiment of the present technique.

In FIG. 10, a indicates the method of controlling the transistors at the time of auto-zero, and b indicates the method of controlling the transistors after auto-zero.

Moreover, in FIG. 10, the differential amplifier circuit 330 is indicated by the graphic symbol of a comparator, and the source follower circuit 230 is indicated by the graphic symbol of a voltage buffer. The auto-zero transistor 323 and the transfer transistor 223 are indicated by the graphic symbol of a switch.

As indicated in a of FIG. 10, the pixel driving circuit 252 turns on the auto-zero transistor 323 and turns off the transfer transistor 223 prior to a comparing operation by a comparator (differential amplifier circuit 330). Thus, the output node of the comparator (differential amplifier circuit 330) and the input node of the source follower circuit 230 can be short-circuited, and feedback can be provided to match the zero of the reference signal and the zero of the pixel signal (that is, auto-zero). A potential $V_{SIN}$ at this point is set as the zero of the pixel signal. According to Equation 1, a potential $V_{SOUT}$ is outputted from the source follower circuit 230 according to the potential $V_{SIN}$.

As indicated in b of FIG. 10, the pixel driving circuit 252 turns off the auto-zero transistor 323 after auto-zero. The DAC 251 changes the reference signal like a slope, and the ADC 310 converts an analog pixel signal, which corresponds to the potential of the initialized floating diffusion layer 224, into a digital signal. The level of the pixel signal at this point is called a P phase or a reset level.

After the conversion into the P phase, the pixel driving circuit 252 turns on the transfer transistor 223 to transfer charge from the photoelectric conversion element 222 to the floating diffusion layer 224. The DAC 251 changes the reference signal like a slope, and the ADC 310 converts an analog pixel signal, which corresponds to the potential of the floating diffusion layer 224 after the transfer, into a digital signal. The level of the pixel signal at this point is called a D phase or a signal level.

In b of FIG. 10, the impedance of the potential $V_{SOUT}$ is reduced by the source follower circuit 230. Thus, even if the reference signal decreases like a slope during the conversion of the P phase and the D phase, the potential $V_{SIN}$ is not changed.

Figure 11:
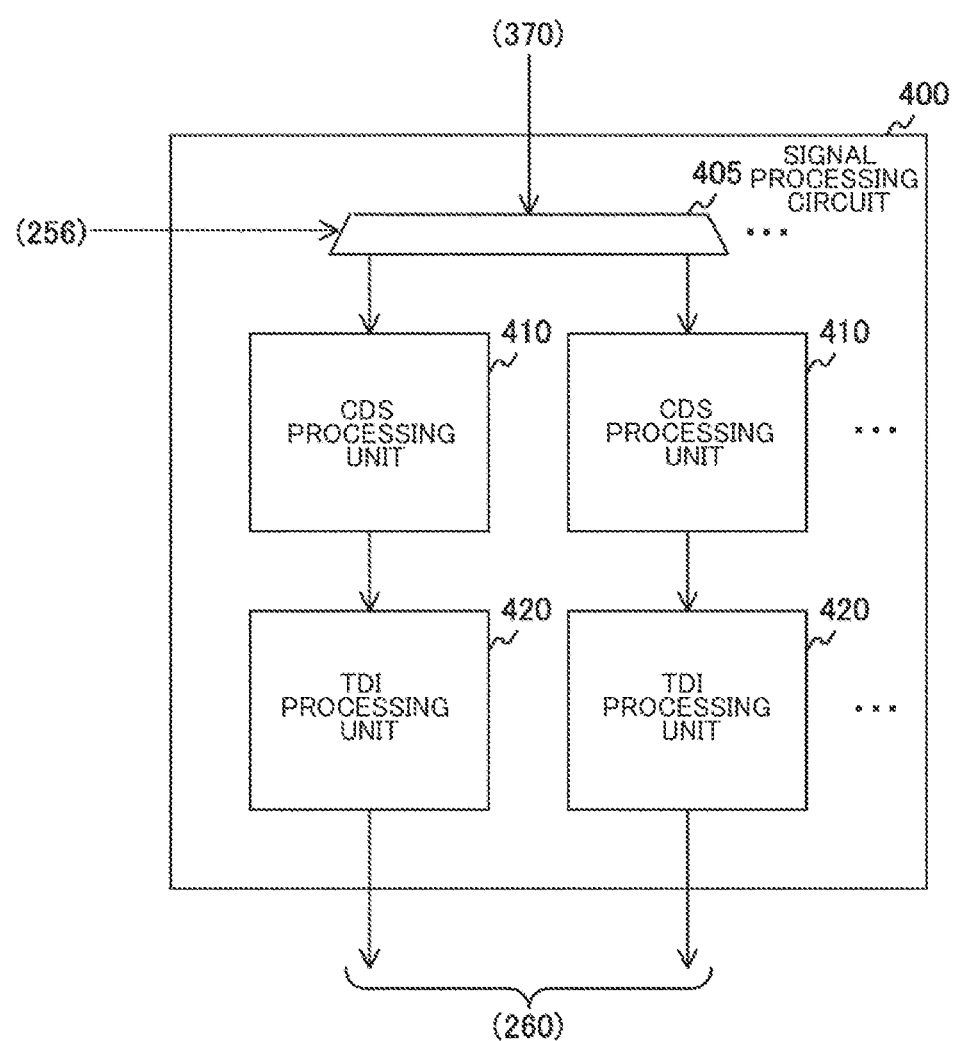
FIG. 11 is a block diagram illustrating a configuration example of a signal processing circuit according to the first embodiment of the present technique.

FIG. 11 is a block diagram illustrating a configuration example of the signal processing circuit 400 according to the first embodiment of the present technique. The signal processing circuit 400 includes a plurality of selectors 405, a plurality of CDS processing units 410, and a plurality of TDI processing units 420.

The selector 405 is provided for each column of the clusters 300, that is, each of the repeater units 370. If the ADCs 310 are arranged in two columns in the cluster 300, the selector 405 is disposed for every two columns. The CDS processing unit 410 and the TDI processing unit 420 are disposed for each column of the ADCs 310. If the ADCs 310 are arranged in M columns, M/2 selectors 405, the M CDS processing units 410, and the M TDI processing units 420 are disposed.

As described above, the repeater unit 370 sequentially outputs the digital signal of the odd-numbered column and the digital signal of the even-numbered column.

The selector 405 selects a destination of a digital signal according to the control of the control circuit 256. If an odd-numbered column is outputted by the repeater unit 370, the selector 405 outputs a digital signal to the CDS processing unit 410 corresponding to the odd-numbered column. If an even-numbered column is outputted, the selector 405 outputs a digital signal to the CDS processing unit 410 corresponding to the even-numbered column.

The CDS processing unit 410 performs CDS processing for determining a difference between the P phase and the D phase, on the digital signal from the selector 405. The CDS processing unit 410 supplies the digital signal of the difference to the TDI processing unit 420.

The TDI processing unit 420 performs, on the digital signal after TDI processing, TDI processing for integrating the digital signal while shifting a time according to the moving speed of a subject. The TDI processing unit 420 supplies the digital signal having been subjected to the TDI processing to the image processing circuit 260.

Figure 12:
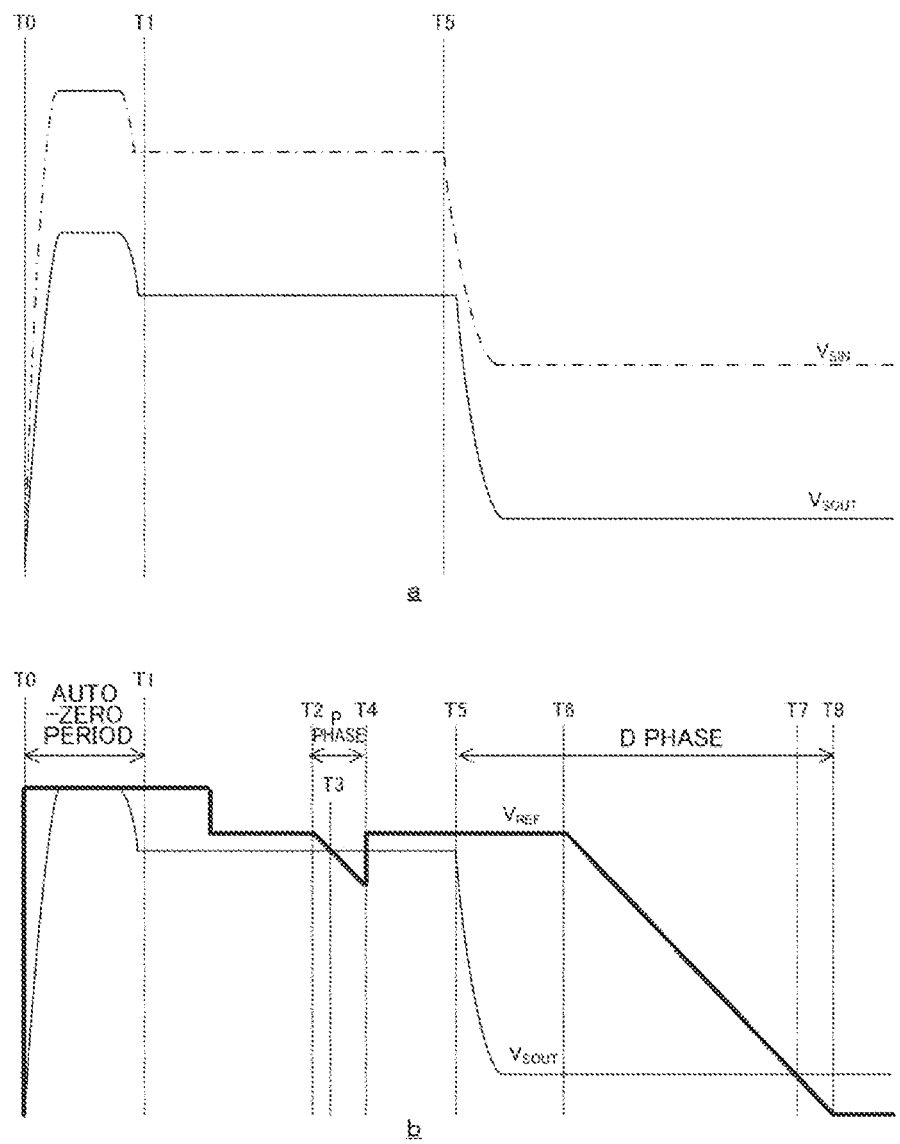
FIG. 12 is a timing chart showing an example of fluctuations in potential according to the first embodiment of the present technique.

FIG. 12 is a timing chart showing an example of fluctuations in potential according to the first embodiment of the present technique. In FIG. 12, a indicates a timing chart of an example of fluctuations in the potential $V_{SIN}$ of the input node and the potential $V_{SOUT}$ of the output node of the source follower circuit 230. In FIG. 12, b indicates a timing chart of an example of fluctuations in the potential $V_{REF}$ of the reference signal and the potential $V_{SOUT}$.

As indicated in a of FIG. 12, in an auto-zero period from timing T0 to T1, the source follower circuit 230 outputs the potential $V_{SOUT}$ from the output node according to the potential $V_{SIN}$ of the input node. The relationship between the potentials is expressed by Equation 1. When charge is transferred at timing T5, the potential $V_{SIN}$ decreases with the amount of charge.

As indicated in b of FIG. 12, in the auto-zero period from the timing T0 to T1, the potential $V_{SOUT}$ of the pixel signal matches the potential $V_{REF}$ of the reference signal. In a period from timing T2 to T4 after the auto-zero, the DAC 251 changes the potential $V_{REF}$ of the reference signal like a slope. The ADC 310 holds a time code at timing T3 when the potential $V_{REF}$ matches the potential $V_{SOUT}$, and then the ADC 310 outputs the time code as a digital signal with a converted P phase.

When charge is transferred at timing T5 after the conversion of the P phase, the potential $V_{SIN}$ decreases with the amount of charge. In a period from timing T6 to T8 after the transfer, the DAC 251 changes the potential $V_{REF}$ of the reference signal like a slope. The ADC 310 holds a time code at timing T7 when the potential $V_{REF}$ matches the potential $V_{SOUT}$, and then the ADC 310 outputs the time code as a digital signal with a converted D phase.

Figure 13:
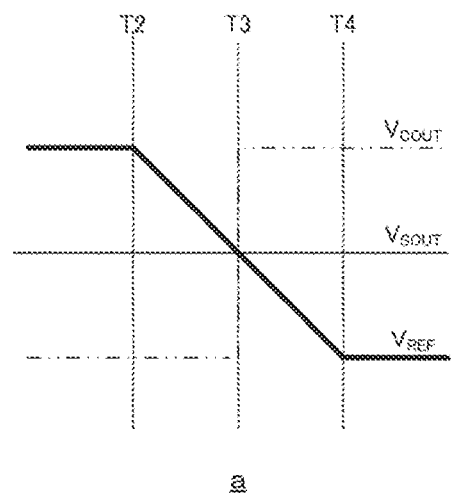
FIG. 13 is a diagram showing an example of timing for inverting the output of a differential amplifier circuit in the first embodiment of the present technique and a first comparative example.
Figure 13:
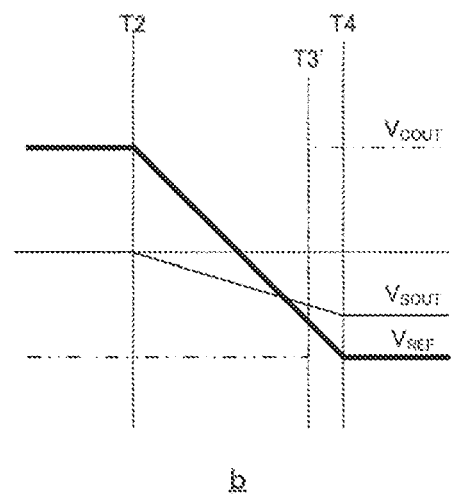

FIG. 13 is a diagram showing an example of timing for inverting the output of the differential amplifier circuit 330 in the first embodiment of the present technique and the first comparative example. In FIG. 13, a is a diagram showing an example of timing for inverting the output of the differential amplifier circuit 330 in the first embodiment. In FIG. 13, b is a diagram showing an example of timing for inverting the output of the differential amplifier circuit 330 in the first comparative example.

As indicated in a of FIG. 13, in the first embodiment where the source follower circuit 230 is added, the potential $V_{COUT}$ of the output node of the differential amplifier circuit 330 is inverted at timing T3 when the potential $V_{REF}$ of the reference signal matches the potential $V_{SOUT}$ of the source follower circuit 230.

As indicated in b of FIG. 13, in the first comparison example where the source follower circuit 230 is not provided, the potential $V_{COUT}$ of the output node is inverted at timing T3' delayed from timing T3. As described above, this is because the value of the potential $V_{REF}$ has an error when matching the potential $V_{SIN}$, and the propagation delay time of the differential amplifier circuit 330 considerably increases. In the first comparison example, a period from timing T3 to T4 when the reference signal is changed like a slope (that is, an AD conversion period) needs to be set longer in consideration of the delay. The extension of the AD conversion period may reduce a frame rate.

In contrast, the configuration additionally including the source follower circuit 230 does not have a delay, allowing the AD conversion period to be shorter than that in the first comparison example. This leads to a higher frame rate.

As described above, according to the first embodiment of the present technique, the source follower circuit 230 supplies a potential to the input node 338 of the differential amplifier circuit 330 according to the potential of the floating diffusion layer, thereby suppressing fluctuations in the potential of the input node 338, the fluctuations being caused by a change of the reference signal. Thus, the extension of the AD conversion period can be suppressed, leading to a higher frame rate. The extension is caused by fluctuations in the potential of the input node 338.

2. Second Embodiment

In the first embodiment, the source follower circuit 230 is disposed in the solid-state imaging element 200 for performing TDI processing. Also in a solid-state imaging element 200 that does not perform TDI processing, a higher frame rate may be requested. A solid-state imaging element 200 of a second embodiment is different from that of the first embodiment in that a source follower circuit 230 is disposed in the solid-state imaging element 200 that does not perform TDI processing.

Figure 14:
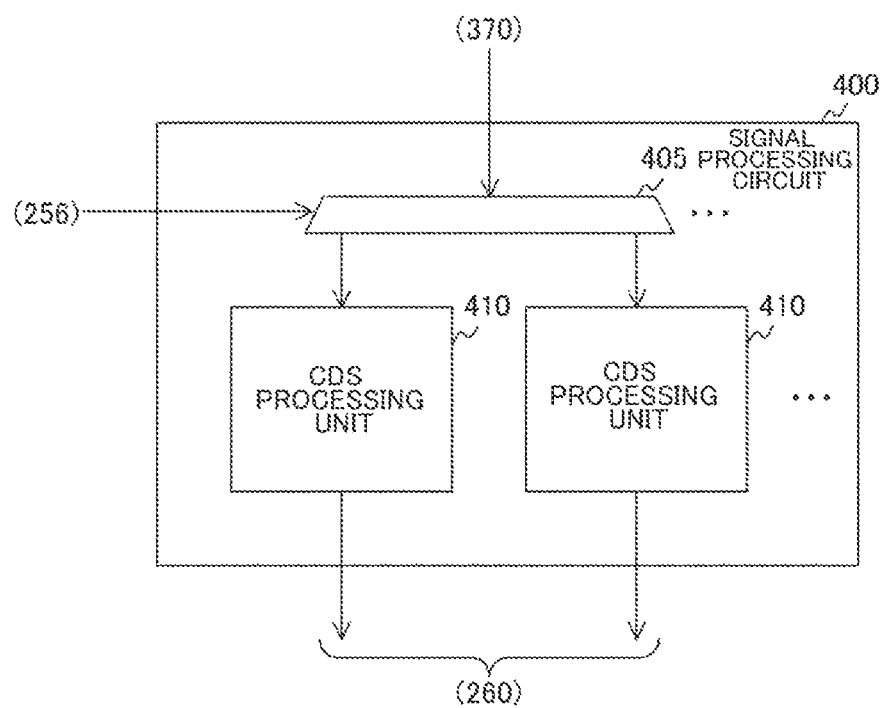
FIG. 14 is a block diagram illustrating a configuration example of a signal processing circuit according to a second embodiment of the present technique.

FIG. 14 is a block diagram illustrating a configuration example of a signal processing circuit 400 according to the second embodiment of the present technique. The signal processing circuit 400 of the second embodiment is different from that of the first embodiment in that TDI processing units 420 are not disposed.

A CDS processing unit 410 supplies a signal having been subjected to CDS processing to an image processing circuit 260, and the image processing circuit 260 performs image processing on a frame having been subjected to CDS processing. The solid-state imaging element 200 configured thus is used for, for example, a digital camera or an electronic device having an imaging function (a smartphone, a personal computer, or the like).

As described above, according to the second embodiment of the present technique, the solid-state imaging element 200 performs image processing on a frame having been subjected to CDS processing, without performing TDI processing. This can improve a frame rate even if TDI processing is not necessary.

<3. Example of Application to Moving Body>

The technique according to the present disclosure (the present technique) can be applied to various products. For example, the technique according to the present disclosure may be realized as a device equipped in any type of moving body such as an automobile, an electric vehicle, a hybrid electric vehicle, a motorcycle, a bicycle, a personal mobility device, an airplane, a drone, a ship, and a robot.

Figure 15:
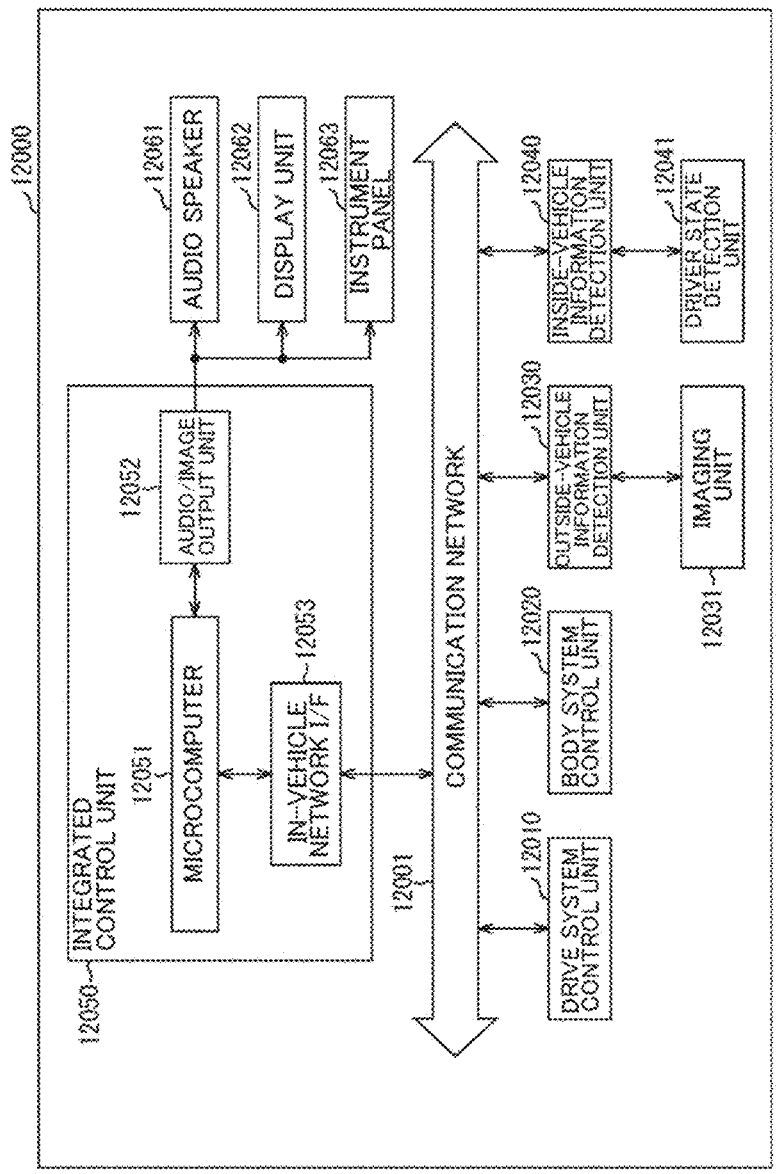
FIG. 15 is a block diagram illustrating a schematic configuration example of a vehicle control system.

FIG. 15 is a block diagram illustrating a schematic configuration example of a vehicle control system, which is an example of a moving body control system to which the technique according to the present disclosure can be applied.

The vehicle control system 12000 includes a plurality of electronic control units connected thereto via a communication network 12001. In the example illustrated in FIG. 15, the vehicle control system 12000 includes a drive system control unit 12010, a body system control unit 12020, an outside-vehicle information detection unit 12030, an inside-vehicle information detection unit 12040, and an integrated control unit 12050. Furthermore, as a functional configuration of the integrated control unit 12050, a microcomputer 12051, an audio/image output unit 12052, and an in-vehicle network I/F (interface) 12053 are illustrated.

The drive system control unit 12010 controls an operation of an apparatus related to a drive system of a vehicle according to various programs. For example, the drive system control unit 12010 acts as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various devices mounted in the vehicle body according to various programs. For example, the body system control unit 12020 acts as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The outside-vehicle information detection unit 12030 detects information on the outside of the vehicle having the vehicle control system 12000 mounted thereon. For example, an imaging unit 12031 is connected to the outside-vehicle information detection unit 12030. The outside-vehicle information detection unit 12030 causes the imaging unit 12031 to capture an image of the outside of the vehicle and receives the captured image. The outside-vehicle information detection unit 12030 may perform object detection processing or distance detection processing for peoples, cars, obstacles, signs, and letters on the road on the basis of the received image.

The imaging unit 12031 is an optical sensor that receives light and outputs an electrical signal according to the amount of the received light. The imaging unit 12031 can also output the electrical signal as an image or distance measurement information. In addition, the light received by the imaging unit 12031 may be visible light or invisible light such as infrared light.

The inside-vehicle information detection unit 12040 detects information on the inside of the vehicle. For example, a driver state detection unit 12041 that detects a driver's state is connected to the inside-vehicle information detection unit 12040. The driver state detection unit 12041 includes, for example, a camera that captures an image of a driver, and the inside-vehicle information detection unit 12040 may calculate a degree of fatigue or concentration of the driver or may determine whether or not the driver is dozing, on the basis of detection information inputted from the driver state detection unit 12041.

The microcomputer 12051 can calculate a control target value of the driving force generation device, the steering mechanism, or the braking device on the basis of information acquired by the outside-vehicle information detection unit 12030 or the inside-vehicle information detection unit 12040 inside and outside the vehicle, and output a control command to the drive system control unit 12010. For example, the microcomputer 12051 can perform cooperative control for the purpose of implementing functions of an ADAS (Advanced Driver Assistance System) including collision avoidance or impact mitigation of the vehicle, follow-up driving based on a following distance, vehicle speed keeping driving, vehicle collision warning, vehicle lane departure warning, or the like.

Furthermore, the microcomputer 12051 can perform cooperative control for the purpose of autonomous driving or the like in which autonomous driving is performed without depending on operations of the driver, by controlling the driving force generator, the steering mechanism, or the braking device and the like on the basis of information about the surroundings of the vehicle, the information being acquired by the outside-vehicle information detection unit 12030 or the inside-vehicle information detection unit 12040.

In addition, the microcomputer 12051 can output a control command to the body system control unit 12020 based on the information acquired by the outside-vehicle information detection unit 12030 outside the vehicle. For example, the microcomputer 12051 can perform cooperative control for the purpose of preventing glare, such as switching from a high beam to a low beam, by controlling the headlamp according to the position of a preceding vehicle or an oncoming vehicle detected by the outside-vehicle information detection unit 12030.

The audio/image output unit 12052 transmits an output signal of at least one of sound and an image to an output device capable of visually or audibly providing notification about information for a passenger or to the outside of the vehicle. In the example illustrated in FIG. 15, an audio speaker 12061, a display unit 12062, and an instrument panel 12063 are illustrated as output devices. The display unit 12062 may include, for example, at least one of an on-board display and a head-up display.

Figure 16:
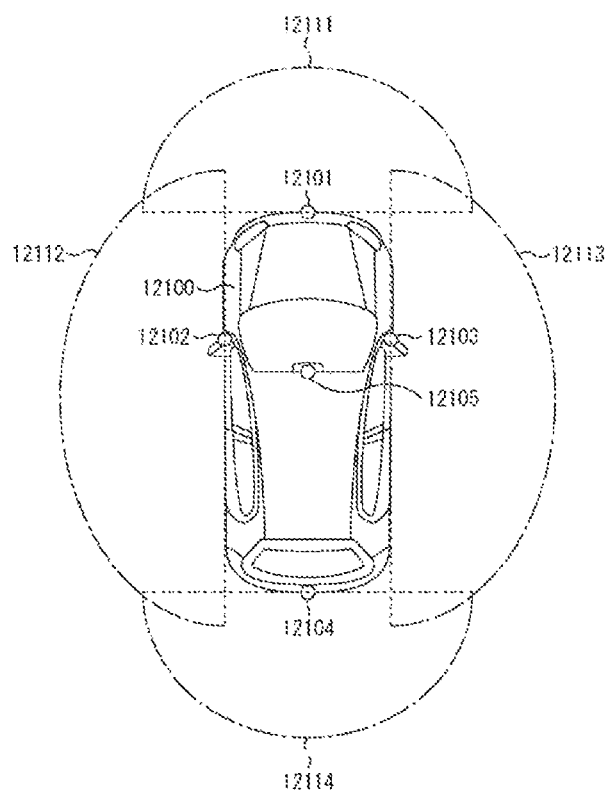
FIG. 16 is an explanatory diagram illustrating an example of the installation position of an imaging unit.

FIG. 16 is a diagram illustrating an example of the installation position of the imaging unit 12031.

In FIG. 16, imaging units 12101, 12102, 12103, 12104, and 12105 are provided as the imaging units 12031.

The imaging units 12101, 12102, 12103, 12104, and 12105 are provided at, for example, positions such as a front nose, side-view mirrors, a rear bumper, a back door, and an upper portion of a windshield in a vehicle interior of the vehicle 12100. The imaging unit 12101 provided on the front nose and the imaging unit 12105 provided in the upper portion of the windshield in the vehicle interior mainly capture images ahead of the vehicle 12100. The imaging units 12102 and 12103 provided on the side-view mirrors mainly capture images of a lateral side of the vehicle 12100. The imaging unit 12104 provided on the rear bumper or the back door mainly captures images behind the vehicle 12100. The imaging unit 12105 provided in the upper portion of the windshield in the vehicle interior is mainly used for detection of preceding vehicles, pedestrians, obstacles, traffic signals, traffic signs, lanes, and the like.

FIG. 16 illustrates an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, by superimposing image data captured by the imaging units 12101 to 12104, it is possible to obtain a bird's-eye view image viewed from the upper side of the vehicle 12100.

At least one of the imaging units 12101 to 12104 may have a function for obtaining distance information. For example, at least one of the imaging units 12101 to 12104 may be a stereo camera including a plurality of imaging elements or may be an imaging element that has pixels for phase difference detection.

For example, the microcomputer 12051 can extract, particularly, a closest three-dimensional object on a traveling path of the vehicle 12100, the three-dimensional object traveling at a predetermined speed (for example, 0 km/h or higher) in the substantially same direction as the vehicle 12100, as a preceding vehicle by determining a distance to each three-dimensional object in the imaging ranges 12111 to 12114 and temporal change in the distance (a relative speed with respect to the vehicle 12100) on the basis of distance information obtained from the imaging units 12101 to 12104. Furthermore, the microcomputer 12051 can set a following distance to be secured in advance from a preceding vehicle and can perform automated brake control (also including follow-up stop control) or automated acceleration control (also including follow-up start control). This can perform cooperative control for the purpose of, for example, autonomous driving in which the vehicle autonomously travels without the need for driver's operations.

For example, the microcomputer 12051 can classify three-dimensional data on three-dimensional objects into two-wheeled vehicles, ordinary vehicles, large-sized vehicles, pedestrians, and other three-dimensional objects such as electric poles on the basis of distance information obtained from the imaging units 12101 to 12104, extract the data, and use the three-dimensional data to perform automated avoidance of obstacles. For example, the microcomputer 12051 classifies surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is outputted to the driver through the audio speaker 12061 or the display unit 12062, forced deceleration or avoidance steering is performed through the drive system control unit 12010, and thus it is possible to perform driving support for collision avoidance.

At least one of the imaging units 12101 to 12104 may be an infrared camera that detects infrared rays. For example, the microcomputer 12051 can recognize a pedestrian by determining the presence or absence of a pedestrian in the captured images of the imaging units 12101 to 12104. Such pedestrian recognition is performed by, for example, the step of extracting feature points in the captured images of the imaging units 12101 to 12104 as infrared cameras and the step of performing pattern matching processing on a series of feature points, which indicate an outline of an object, to determine whether or not the object is a pedestrian. When the microcomputer 12051 determines the presence of a pedestrian in the captured images of the imaging units 12101 to 12104 and recognizes the pedestrian, the audio/image output unit 12052 controls the display unit 12062 such that a square contour line for emphasis is superimposed and displayed on the recognized pedestrian. In addition, the audio/image output unit 12052 may control the display unit 12062 such that an icon or the like indicating a pedestrian is displayed at a desired position.

An example of the vehicle control system, to which the technique according to the present disclosure is applicable, was described above. The technique according to the present disclosure can be applied to the imaging unit 12031 within the configuration described above. Specifically, the imaging device 100 of FIG. 1 can be applied to, for example, the imaging unit 12031. By applying the technique according to the present disclosure to the imaging unit 12031, a frame rate can be improved to generate video with higher image quality.

It should be noted that the above-described embodiments show examples for embodying the present technique, and matters in the embodiments and matters specifying the invention in the claims have a corresponding relationship with each other. Similarly, the matters specifying the invention in the claims and the matters in the embodiments of the present technique having the same name have a corresponding relationship with each other. However, the present technique is not limited to the embodiments and can be embodied by applying various modifications to the embodiments without departing from the gist thereof.

The effects described in the present specification are merely examples and are not intended as limiting, and other effects may be obtained.

The present technique can also have the following configurations.

(1) A solid-state imaging element including: a differential amplifier circuit that amplifies a difference between the potentials of a pair of input nodes and outputs the difference from an output node;
a transfer transistor that transfers charge from a photoelectric conversion element to a floating diffusion layer;
an auto-zero transistor that short-circuits the floating diffusion layer and the output node in a predetermined period; and
a source follower circuit that supplies a potential to one of the pair of input nodes according to a potential of the floating diffusion layer.

(2) The solid-state imaging element according to (1), further including a signal processing unit that performs predetermined signal processing on a digital signal corresponding to the difference.

(3) The solid-state imaging element according to (2), the signal processing includes correlated double sampling.

(4) The solid-state imaging element according to (5), wherein the signal processing further includes time delay integration.

(5) The solid-state imaging element according to any one of (1) to (4), wherein the source follower circuit includes:
a first current source transistor that supplies a predetermined current; and a source follower transistor that has the gate connected to the floating diffusion layer and the source connected to the first current source transistor and one of the pair of input nodes.

(6) The solid-state imaging element according to any one of (1) to (5), wherein the differential amplifier circuit includes:
a pair of differential transistors; and
a second current source transistor that is commonly connected to the sources of the pair of differential transistors and supplies a predetermined current, a predetermined reference signal is inputted to one of the gates of the pair of differential transistors, and
the potential from the source follower circuit is inputted to the other gate of the pair of differential transistors.

(7) The solid-state imaging element according to any one of (1) to (6), wherein the transfer transistor, the source follower circuit, and a part of the differential amplifier circuit are provided on a predetermined light-receiving chip, and the rest of the differential amplifier circuit is provided on a predetermined circuit chip.

(8) The solid-state imaging element according to (8), wherein the light-receiving chip and the circuit chip are connected by Cu—Cu bonding.

(9) An imaging device including: a differential amplifier circuit that amplifies a difference between the potentials of a pair of input nodes and outputs the difference from an output node;
a transfer transistor that transfers charge from a photoelectric conversion element to a floating diffusion layer;
an auto-zero transistor that short-circuits the floating diffusion layer and the output node in a predetermined period;
a source follower circuit that supplies a potential to one of the pair of input nodes according to a potential of the floating diffusion layer; and
a storage unit that stores a frame in which a digital signal corresponding to the difference is arranged.

REFERENCE SIGNS LIST

100 Imaging device
110 Optical unit
120 Storage unit
130 Control unit
140 Communication unit
200 Solid-state imaging element
201 Light-receiving chip
202 Circuit chip
210 Pixel array unit
211 Pixel block
212 Peripheral circuit
220 Pixel circuit
221 Discharge transistor
222 Photoelectric conversion element
223 Transfer transistor
224 Floating diffusion layer
230 Source follower circuit
231 Source follower transistor
232, 333 Current source transistor
251 DAC
252 Pixel driving circuit
253 Time code generating unit
254 Pixel AD conversion unit
255 Vertical scanning circuit
256 Control circuit
257 Output circuit
260 Image processing circuit
300 Cluster
310 ADC
320 Differential amplifier
321, 331, 334, 341, 342, 344, 345 pMOS transistor
322, 343, 346, 347 nMOS transistor
323 Auto-zero transistor
330 Differential amplifier circuit
332, 335 Differential transistor
340 Positive feedback circuit
350 Latch control circuit
360 Latch circuit
370 Repeater unit
400 Signal processing circuit
405 Selector
410 CDS processing unit
420 TDI processing unit
510 Belt conveyor
511 Subject
12031 Imaging unit

The invention claimed is:
1. A solid-state imaging element comprising:
a differential amplifier circuit that amplifies a difference between potentials of a pair of input nodes and outputs the difference from an output node;
a transfer transistor that transfers charge from a photoelectric conversion element to a floating diffusion layer;
an auto-zero transistor that short-circuits the floating diffusion layer and the output node in a predetermined period; and
a source follower circuit that supplies a potential to one of the pair of input nodes according to a potential of the floating diffusion layer, wherein
the differential amplifier circuit includes:
first and second differential transistors; and
a first current source transistor that is commonly connected to sources of the first and second differential transistors and that supplies a first predetermined current, wherein
a predetermined reference signal is inputted to a gate of the first differential transistor, and
the potential from the source follower circuit is inputted to a gate of the second differential transistor.

2. The solid-state imaging element according to claim 1, further comprising a signal processor configured to perform predetermined signal processing on a digital signal according to the difference.

3. The solid-state imaging element according to claim 2, wherein the signal processing includes correlated double sampling.

4. The solid-state imaging element according to claim 3, wherein the signal processing further includes time delay integration.

5. The solid-state imaging element according to claim 1, wherein
the source follower circuit includes:
a second current source transistor that supplies a second predetermined current; and
a source follower transistor that has a gate connected to the floating diffusion layer and a source connected to the second current source transistor and one of the pair of input nodes.

6. The solid-state imaging element according to claim 1, wherein
the transfer transistor, the auto-zero transistor, the source follower circuit, and a part of the differential amplifier circuit are provided on a predetermined light-receiving chip, and rest of the differential amplifier circuit is provided on a predetermined circuit chip.

7. The solid-state imaging element according to claim 6, wherein the light-receiving chip and the circuit chip are connected by Cu—Cu bonding.

8. An imaging device comprising:
a differential amplifier circuit that amplifies a difference between potentials of a pair of input nodes and outputs the difference from an output node;
a transfer transistor that transfers charge from a photoelectric conversion element to a floating diffusion layer;
an auto-zero transistor that short-circuits the floating diffusion layer and the output node in a predetermined period; and
a source follower circuit that supplies a potential to one of the pair of input nodes according to a potential of the floating diffusion layer; and
a storage unit that stores a frame in which a digital signal according to the difference is arranged, wherein
the differential amplifier circuit includes:
first and second differential transistors; and
a first current source transistor that is commonly connected to sources of the first and second differential transistors and that supplies a first predetermined current, wherein
a predetermined reference signal is inputted to a gate of the first differential transistor, and
the potential from the source follower circuit is inputted to a gate of the second differential transistor.

9. The imaging device according to claim 8, further comprising:
a signal processor configured to perform predetermined signal processing on the digital signal according to the difference.

10. The imaging device according to claim 9, wherein the signal processing includes correlated double sampling.

11. The imaging device according to claim 10, wherein the signal processing further includes time delay integration.

12. The imaging device according to claim 8, wherein
the source follower circuit includes:
a second current source transistor that supplies a second predetermined current; and
a source follower transistor that has a gate connected to the floating diffusion layer and a source connected to the second current source transistor and one of the pair of input nodes.

13. The imaging device according to claim 8, wherein
the transfer transistor, the auto-zero transistor, the source follower circuit, and a part of the differential amplifier circuit are provided on a predetermined light-receiving chip, and rest of the differential amplifier circuit is provided on a predetermined circuit chip.

14. The imaging device according to claim 13, wherein the light-receiving chip and the circuit chip are connected by Cu—Cu bonding.

* * * * *